(12) United States Patent
Gardner

(10) Patent No.: US 10,004,157 B2
(45) Date of Patent: *Jun. 19, 2018

(54) MOBILE SOFT DUCT SYSTEM

(71) Applicant: Amazon Technologies, Inc., Reno, NV (US)

(72) Inventor: Brock Robert Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 10 days.

This patent is subject to a terminal disclaimer.

(21) Appl. No.: 14/875,183

(22) Filed: Oct. 5, 2015

(65) Prior Publication Data

US 2016/0029513 A1 Jan. 28, 2016

Related U.S. Application Data

(63) Continuation of application No. 13/966,054, filed on Aug. 13, 2013, now Pat. No. 9,152,191.

(51) Int. Cl.
*F24F 13/02* (2006.01)
*F24F 7/00* (2006.01)
(Continued)

(52) U.S. Cl.
CPC ......... *H05K 7/20209* (2013.01); *F24D 15/00* (2013.01); *F24F 7/00* (2013.01);
(Continued)

(58) Field of Classification Search
CPC . H01L 23/467; F24F 13/0209; F24F 13/0254; F24F 13/02; F24F 13/0218;
(Continued)

(56) References Cited

U.S. PATENT DOCUMENTS 3,088,392 A * 5/1963 Egan .................. E04B 9/02
454/298
3,177,796 A * 4/1965 Lee ................... F24F 13/072
454/301
(Continued)

FOREIGN PATENT DOCUMENTS

JP 2005005126 1/2005

OTHER PUBLICATIONS

"Fabric ductwork for open ceiling/finished ceiling architecture applications | DuctSox", http://www.ductsox.com/products/open-ceiling-architecture, Visted Jun. 24, 2013, pp. 1-36.
(Continued)

*Primary Examiner* — Adam B Dravininkas
(74) *Attorney, Agent, or Firm* — Robert C. Kowert; Meyertons, Hood, Kivlin, Kowert & Goetzel, P.C.

(57) ABSTRACT

A Mobile Soft Duct System includes a soft duct that can be extended and retracted along a track to deliver an air supply to various locations. A vent attached to a part of the soft duct system can include a flow control element that can be adjusted to direct air to a target location. Managing a soft duct system can include monitoring an environment to detect temperature hotspots and configuring the soft duct system, in response to detection of a hotspot at a particular location, to deliver air to the particular location to mitigate the hotspot. Configuring the soft duct system can include extending the soft duct along the track and adjusting a flow control element in a vent to direct air to the particular location. Soft duct system management can be implemented by one or more computer systems.

20 Claims, 10 Drawing Sheets

(51) Int. Cl.
*H05K 7/20* (2006.01)
*G06F 1/20* (2006.01)
*F24D 15/00* (2006.01)
*G05B 15/02* (2006.01)

(52) U.S. Cl.
CPC .......... *F24F 13/02* (2013.01); *F24F 13/0218* (2013.01); *G05B 15/02* (2013.01); *G06F 1/20* (2013.01); *G06F 1/206* (2013.01); *H05K 7/20145* (2013.01); *H05K 7/20745* (2013.01)

(58) Field of Classification Search
CPC .. F24F 13/0263; F24F 13/072; F24F 13/0245; F24F 11/053; F24F 13/10; F24F 7/00; H02K 3/22; H02K 3/24; H02K 1/32; H02K 9/005; G06F 1/20; G06F 1/206; H05K 7/20145; H05K 7/20572; H05K 7/20745; H05K 7/186; H05K 7/20163; H05K 7/20209; G05B 15/02; F24D 15/00
See application file for complete search history.

(56) References Cited

U.S. PATENT DOCUMENTS

| | | | | |
|---|---|---|---|---|
| 3,520,244 A | * | 7/1970 | Gaines, Jr. | F16L 3/00 138/107 |
| 3,777,506 A | * | 12/1973 | Hergatt | F24F 1/025 62/237 |
| 3,815,486 A | * | 6/1974 | Morrison | F24F 13/072 454/301 |
| 3,913,470 A | * | 10/1975 | Cullen | B08B 15/005 137/580 |
| 4,625,631 A | * | 12/1986 | Vera | E21F 1/04 104/182 |
| 4,632,019 A | * | 12/1986 | Whiteman | B64F 1/364 454/119 |
| 5,129,690 A | * | 7/1992 | Meinig | F16L 23/08 285/363 |
| 5,314,212 A | * | 5/1994 | Sanders | F16L 41/082 285/189 |
| 5,383,335 A | * | 1/1995 | Anderson | B64F 1/362 62/237 |
| 5,655,963 A | | 8/1997 | Paschke et al. | |
| 5,769,708 A | | 6/1998 | Paschke | |
| 5,931,012 A | * | 8/1999 | Robertson | B60H 1/00257 248/419 |
| 6,167,714 B1 | | 1/2001 | Baffes | |
| 6,280,320 B1 | | 8/2001 | Paschke et al. | |
| 6,405,549 B1 | | 6/2002 | Baffes | |
| 6,425,417 B1 | * | 7/2002 | Paschke | F24F 13/0218 138/106 |
| 6,558,250 B1 | | 5/2003 | Paschke | |
| 6,616,524 B2 | | 9/2003 | Storck, Jr. et al. | |
| 6,960,130 B2 | | 11/2005 | Gebke et al. | |
| 6,983,899 B2 | | 1/2006 | Melendez | |
| 6,997,390 B2 | | 2/2006 | Alles | |
| 7,500,911 B2 | | 3/2009 | Johnson et al. | |
| 8,051,671 B2 | | 11/2011 | Vinson et al. | |
| 8,154,870 B1 | | 4/2012 | Czamara et al. | |
| 8,434,526 B1 | * | 5/2013 | Pinkalla | 138/106 |
| 8,808,075 B2 | | 8/2014 | Gebke et al. | |
| 9,157,645 B1 | * | 10/2015 | Goss | F24F 7/00 |
| 2003/0036346 A1 | * | 2/2003 | Wilson | B60H 1/00257 454/119 |
| 2004/0229559 A1 | * | 11/2004 | Gebke | F24F 13/0218 454/306 |
| 2006/0252365 A1 | * | 11/2006 | Gebke | F24F 11/043 454/306 |
| 2008/0291625 A1 | | 11/2008 | Rathbun, II et al. | |
| 2010/0300650 A1 | | 12/2010 | Bean, Jr. | |
| 2013/0088833 A1 | | 4/2013 | Cox et al. | |
| 2014/0202540 A1 | * | 7/2014 | Gebke | F16L 11/02 137/1 |

OTHER PUBLICATIONS

U.S. Appl. No. 13/966,054, filed Aug. 13, 2013, Brock Robert Gardner.

\* cited by examiner

MOBILE SOFT DUCT SYSTEM

This application is a continuation of U.S. patent application Ser. No. 13/966,054, filed Aug. 13, 2013, now U.S. Pat. No. 9,152,191, which is hereby incorporated by reference herein in its entirety.

BACKGROUND

Organizations such as on-line retailers, network-based service providers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Many data centers rely on forced air systems and air conditioning to maintain the temperatures and other environmental conditions in the data center within acceptable limits. The initial and ongoing costs of installing and operating these systems may add substantial cost and complexity to data center operations. Many existing methods and apparatus may not, moreover, supply air for cooling in an effective manner to where it is most needed.

Moreover, some known data centers include multiple rack computing systems having configurations that are non-uniform with respect to component density and usage, such that each rack computing system generates waste heat at a non-uniform rate as compared to other rack computing systems. In such data centers, application of uniform heat removal methods and apparatus to such non-uniform waste heat generation sources may not be fully efficient and effective in waste heat removal.

A disparity between a data center's heat removal capabilities and non-uniform waste heat generation by rack computing systems can lead to the creation of localized temperature anomalies in and around certain rack computing systems, including hotspots and coldspots, which can damage equipment if not mitigated. Modifying uniform cooling systems in a data center for such additional capacity to accommodate temperature fluctuations and non-uniform waste heat generation, is resource-intensive and may take many months to implement. Furthermore, using uniform cooling systems to mitigate short-term temperature anomalies caused by fluctuations in computing capacity needs at various rack computing systems can be an inefficient use of resources.

Figure 1:
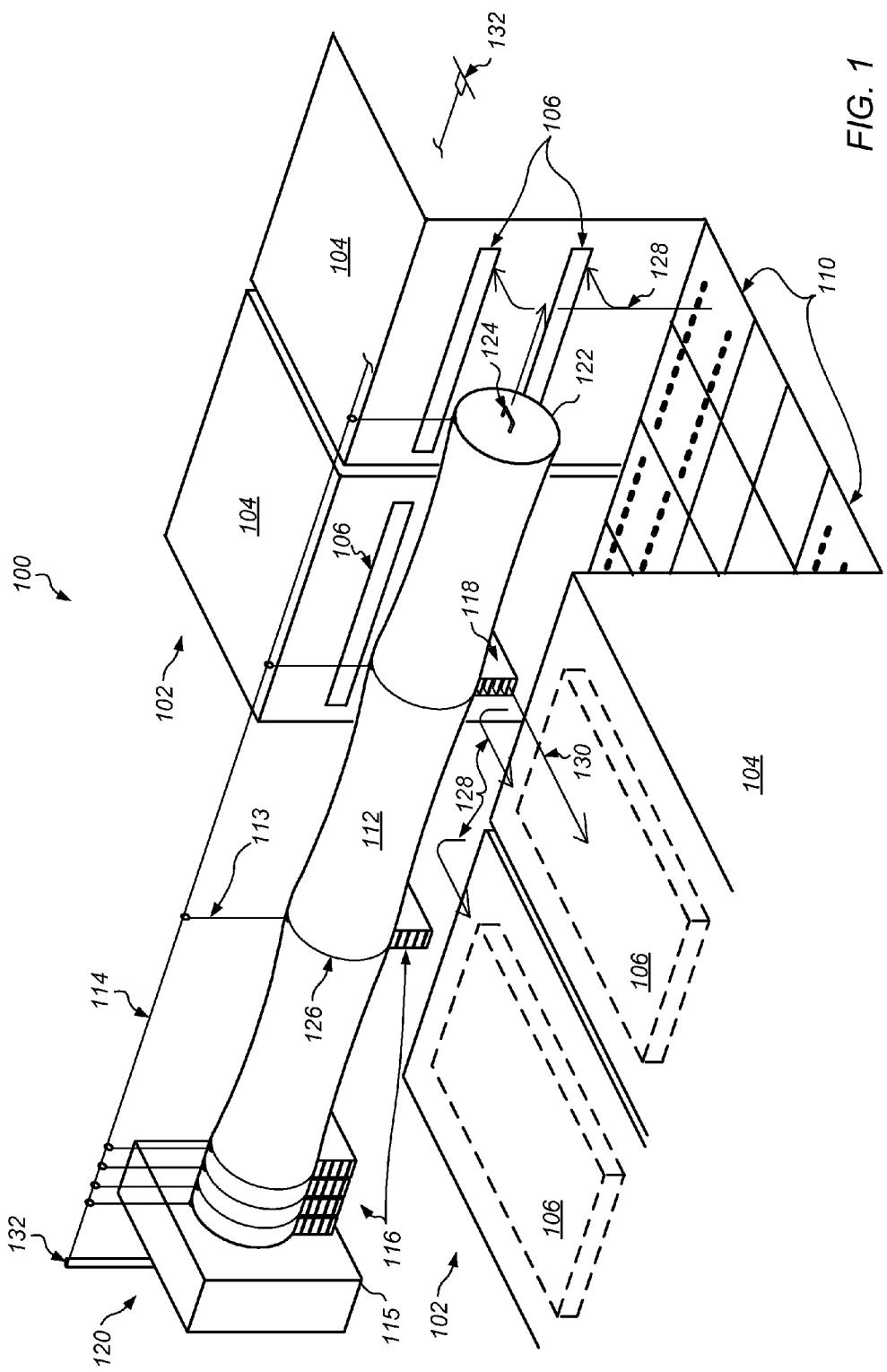
FIG. 1 illustrates a data center with an extended mobile soft duct system according to one embodiment.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of cooling systems, and systems and methods of managing flow of air to electrical systems are disclosed. According to one embodiment, a data center includes a computing room that has a row of rack computing systems and a cold aisle extending along the row, a primary cooling system that supplies primary air to the rack computing systems from the cold aisle to meet rack computing system cooling requirements, and a mobile soft duct cooling system that supplies supplementary air to a rack computing system from the cold aisle. The mobile soft duct cooling system includes a track that extends along the cold aisle and a soft duct. The soft duct includes a collapsible conduit with an interior passage, a ring coupled to the conduit surface and extending circumferentially along at least a portion of the conduit surface, a hanger coupled to the ring at one end and movably coupled to the track at the other end so that the collapsible conduit is extended by moving the hanger along the track to move the ring along the track, and a vent attached to the ring that has an outlet with adjustable louvers so that the vent provides an adjustable airflow from the conduit based on adjustment of the louvers. The soft duct can be extended along the track to a targeted position so that the vent supplies supplementary air to one of the rack computing systems.

According to one embodiment, a system includes a track that spans a length of space, a soft duct that has a passage at least partially bounded by a flexible material, and a vent attached to the soft duct that has an outlet and directs air supplied through the soft duct passage via the outlet, and a coupling device that movably couples a portion of the soft duct to a portion of the track, so that the soft duct is reversibly extended along the length of space to position the vent at a target location to supply air to a cooling target.

According to one embodiment, a method includes performing, by a computing device, directing a motor to movably extend a portion of a soft duct along a predetermined track so that a vent coupled to the soft duct is positioned a minimum distance from a target location, and directing an air distribution system to direct air through an interior of the soft duct and through a vent outlet to direct the air to a target location.

As used herein, "air distribution system" means a system that provides or moves air to, or removes air from, one or more systems or components.

As used herein, an "aisle" means a space next to one or more racks.

As used herein, "ambient" refers to a condition of outside air at the location of a system or data center.

As used herein, to "cinch" means to pull around at least a portion of the exterior of an element, such as a duct, in a manner that tends to reduce the size of the element. Examples of cinching members for a duct include strap, a rope, a chain, a belt, or a cord.

As used herein, to "contract" a passage means to make the passage smaller (for example, shrink the size of the passage such that the cross sectional area of the passage is reduced).

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "data center module" means a module that includes, or is suitable for housing and/or physically supporting, one or more computer systems that can provide computing resources for a data center.

As used herein, to "dilate" a passage means to make the passage larger (for example, allow the size of the passage to expand such that the cross sectional area of the passage is increased).

As used herein, to "direct" air includes directing or channeling air, such as to a region or point in space.

As used herein, to "mitigate" means to reduce the severity of, or risk of damage from, something, such as a load, phenomenon, anomaly, or event.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "motor" means a machine that can convert energy into mechanical motion. Examples of motors include an electrical motor, a hydraulic motor, an actuator, a belt drive, and a chain drive.

As used herein, a "rack" means a rack, container, frame, or other element or combination of elements that can contain or physically support one or more computer systems.

As used herein, "rack computing system" means a system that includes one or more computing devices mounted in a rack.

As used herein, "room" means a room or a space of a building. As used herein, "computing room" means a room of a building in which computing devices, such as rack-mounted servers, can be operated.

As used herein, a "space" means a space, area or volume.

As used herein, a "duct" includes any tube, pipe, conduit, or combination thereof that has one or more passages through which a fluid can be conveyed. A duct may include one or more passages at least partially bounded by one or more types of material. Examples of materials for a duct include cloth, fabric, extruded metal, sheet metal, a polymer, or a combination thereof. A passage of a duct may have any size and shape. For example, the cross section of a duct may be square, round, ovate, rectangular, polygonal, or irregular. A passage of a duct may have a constant or changing cross section or a cross section that changes over the length of the passage.

As used herein, a "soft duct" means a duct that can be flexed, bent, extended, collapsed, stretched, or compressed to change the shape of the duct. Examples of materials for a soft duct include fabric, cloth, polymeric sheeting, or other flexible materials.

In various embodiments, an air distribution system includes a mobile soft duct system that is reversibly configurable to supply air to one or more various locations. In some embodiments, the mobile soft duct system can be extended along a track to a targeted position to deliver air to one or more target locations. Air delivery can be facilitated by one or more vents including flow control elements that can be adjusted to direct air to a target location.

In some embodiments, the mobile soft duct system is a supplementary air distribution system that complements a primary air distribution system, such that the mobile soft duct system is used to supply air if the air supplied provided by the primary air distribution system is insufficient for certain needs. For example, in a data center environment, a rack computing system under increased use may require a greater immediate intake of air than a primary cooling system can provide, where a mobile soft duct system can be extended into position to supply additional air to the rack computing system to meet its immediate air needs, after which time the mobile soft duct system may be refracted and the primary cooling system may resume supplying all of the air once the primary cooling system is once again able to unilaterally meet the rack computing system's cooling needs.

In some embodiments, the mobile soft duct system can be at least partially motorized, so that one or more components of the mobile soft duct system, including a reversible extension of some or all of the soft duct, adjustment of one or more flow control elements to direct air flow, and the like can be managed by a control system. For example, one or more components of a mobile soft duct system may be controlled by a wall-mounted control system based upon user inputs.

In some embodiments, the control system may manage the mobile soft duct system to respond to and mitigate localized environmental anomalies. For example, in a data center environment, a control system may respond to detection of a temperature hotspot at a rack computing system by managing one or more components of the mobile soft duct system to deliver air to the rack computing system to reduce the temperature and mitigate the hotspot. The control system may manage multiple components to balance air distribution through various vents in the system.

In some embodiments, some or all of a soft duct in the mobile soft duct system can include a duct-contracting component that can reversibly contract or dilate at least a portion of a soft duct to augment parameters of air flow through one or more passages of the portion of the soft duct.

FIG. 1 illustrates a data center 100 with two rows 102 of rack computing systems 104, a primary cooling system, and an extended mobile soft duct system 120 according to one embodiment. The illustrated data center 100 may show a cutaway view of at least some rack computing systems 104 to expose one or more computing systems 106 and to at least partially expose mobile soft duct system 120.

Data center 100 includes rack computing systems 104 arranged in rows 102, such that an aisle extends between the rows 102. Rack computing systems 104 may include one or more computing systems 106. In some embodiments, each computing system 106 includes modules that generate waste heat during operation. In some embodiments, if the waste heat is not removed, the computing system 106 components may be damaged. Excess waste heat may manifest as an environmental anomaly, including a temperature hotspot, which can be identified using temperature sensors. Anomalies may be localized; for example, a temperature hotspot may be localized to a particular portion of rack computing system 104, including some or all of an individual computing system 106.

Each computing system 106 may cool the various modules therein by receiving air from the aisle to absorb and remove waste heat from the computing system 106. Such cooling may be passive, such that the computing system 106 is constructed to allow air to pass through without requiring use of an internal blower or other air moving device. The air may pass through one or more conduits (not shown in FIG. 1) in each computing system 106, where the air absorbs and removes waste heat generated by the various modules, thereby cooling the computing system 106. In some embodiments, a conduit is located within an individual computing system 106. In some embodiments, a conduit is at least partially located external to a computing system 106 and within rack computing system 104. For example, a conduit may pass between individual computing systems 106 in rack computing system 104.

Mobile soft duct system 120 includes a soft duct 112 that may be extended from an air handling unit 115 along a path that follows a track 114. In some embodiments, the soft duct 112 includes a conduit that directs air 130 supplied by the air handling unit 115 to one or more various locations in an environment. For example, in the illustrated embodiment, multiple vents 116 and 118 coupled to the soft duct 112 may direct air 130 supplied through the conduit of the soft duct 112 by air handling unit 115 to one or more computing systems 106 in the aisle. Air handling unit 115 may include an air moving device, such as a blower, a fan, or the like.

In some embodiments, soft duct 112 can be extended or retracted along a path that follows track 114. For example, soft duct 112 may be coupled to various coupling devices 113 that are movably coupled to track 114, and the coupling devices 113 may be moved along track 114 to move portions of soft duct 112, thereby extending or retracting portions of the soft duct 112. As shown in the illustrated embodiment, soft duct 112 is partially extended along the aisle between the rows 102 of rack computing systems, so that a portion of the soft duct 112 is retracted near the air handling unit 115. In some embodiments, soft duct 112 is at least partially comprised of a flexible material that enables the soft duct to be collapsed along the path following the track 114, so that retracted portions of the soft duct 112 are collapsed, as shown in the illustrated embodiment. In some embodiments, a portion of the soft duct 112 is collapsed when two or more coupling devices 113 are moved together.

In some embodiments, coupling devices 113 are coupled directly to the material bounding a conduit in the soft duct 112. For example, where the soft duct 112 is comprised of a strong flexible material, the coupling devices 113 may be directly attached to the material of the soft duct 112 so that the weight of the soft duct 112 is transferred to the coupling devices 113 through the material. In some embodiments, coupling devices 113 are coupled to a structural component that supports the material. For example, a hoop structure 126, located inside a conduit of soft duct 112, may be coupled to one or more coupling devices 113 so that the weight of the soft duct 112 is transferred to the coupling devices 113 through one or more hoop structures. In some embodiments, the soft duct 112 is extended by moving one or more coupling devices 113 along track 114, which moves one or more hoop structures 126 coupled to the soft duct, thereby extending or retracting portions of the soft duct 112.

In some embodiments, the mobile soft duct system 120 is configured to adjust the distance of the soft duct 112 from the track 114. For example, where the particular computing system 106 to be supplied air via vent 118 is close to the floor of data center 100, mobile soft duct system 120 may be configured to lower at least a portion of the soft duct 112 closer to the floor, so that air 130 can be directed from vent 118 to the particular computing system 106.

In some embodiments, coupling devices 113 are spaced a predetermined distance along the soft duct 112 to divide the soft duct 112 into portions. For example, in the illustrated embodiment of a data center 100, where rack computing systems 104 may have a certain width, such as 24 inches, each portion of the soft duct 112 may be an equal distance in length. Each portion may include one or more vents 116 and 118, which may be spaced so that, when a portion of the soft duct 112 is extended along the aisle, one or more vents 116 is aligned with a rack computing system 104. For example, in the illustrated embodiment, soft duct 112 is extended to a particular configuration so that vent 118 is aligned with rack computing system 104.

In some embodiments, each vent 116 and 118 includes one or more flow control elements that can direct flow of air to one or more particular locations in an environment. In the illustrated embodiment, for example, vent 118 includes a flow control element that is adjusted to direct air 130 from an internal passage of soft duct 112 to conduit 106 of rack computing system 104 as intake air. In addition, vents 116 include flow control elements adjusted to restrict air from exiting one or more internal passages through the vents 116.

Soft duct 112 may include an end plate 122 that caps the soft duct at an end of the at least one conduit opposite the air handling unit 115, thereby restricting air from flowing out the end of the soft duct 112. In some embodiments, the end plate 122 includes one or more attachment assemblies that enable the soft duct to be extended or retracted along the path. For example, in the illustrated embodiment, end plate 122 includes a handle 124 that enables a user to pull the soft duct 112 along the path to extend it, push it to retract it, or some combination thereof. In some embodiments, end plate 122 includes an attachment point for a tool, including a hook, to pull or push the soft duct 112 along the path. In other embodiments, a handle 124 or a tool attachment point may be alternatively (or additionally) located at other positions on or along soft duct 112, such as at one or more of vents 116, 118 and/or at one or more of hoop structures 126.

Soft duct 112 may include one or more attachment points that allow one soft duct to be coupled to, or detached from, another soft duct, thereby effectively extending or retracting the soft duct 112. For example, end plate 122 may be removable and soft duct 112 may include one or more various attachment devices, including a clip, that can attach the soft duct 112 with another soft duct so that one or more passages in soft duct 112 can communicate air through an additional passage in the another soft duct.

In some embodiments, the track 114 follows a particular path, so that the soft duct may be extended along the path to deliver air to target locations proximate to the path. For example, in the illustrated data center embodiment, track 114 is a tension cable that generally extends between two wall attachment points 132 along the aisle that extends between the rows 102 of rack computing systems 104 so that the soft duct 112 may be extended along the aisle to deliver air 130 to one or more rack computing systems 104 from the aisle. In some embodiments, such as where the air handling unit 115 is located at a wall of a room, the track may extend from an attachment point 132 on the wall near the air handling unit 115. For example, track 114 may be a rigid metal track that includes curves so that soft duct 112 can be extended or retracted along a non-linear path. In some embodiments, the track may extend from various locations. For example, where the air handling unit 115 is located in a ceiling of data center 100, the track 114 may extend from the ceiling and curve so that the soft duct 112 continues to extend along the aisle.

In some embodiments, mobile soft duct system 120 supplies air to various computing systems 106 included in the rack computing systems 104 in data center 100. For example, soft duct 112 may be extended, and flow control elements in vents 116 and 118 adjusted, to direct air 130 to some or all selected computing systems 106 in each rack computing system 104 to meet their cooling air needs. In some embodiments, mobile soft duct system 120 is a supplementary cooling system for data center 100 that supplements or replaces another air distribution system in providing air to one or more rack computing systems 104. For example, in the illustrated embodiment, data center 100 includes a primary cooling system that comprises a raised floor plenum, where air 128 may be distributed through the raised floor plenum and supplied to the rack computing systems 104 through particular floor tiles 110 in the raised floor in the aisle.

In some embodiments, mobile soft duct system 120 supplies supplementary air 130 to at least a portion of one or more rack computing systems 104 to supplement or replace the air 128 supplied by the primary cooling system in response to the primary cooling system being insufficient to the cooling air needs of one or more portions of one or more rack computing systems 104. For example, where usage of a particular portion of a rack computing system 104, such as one or more computer systems 106, fluctuates over time, such that the cooling needs of the portion of the rack computing system 104 exceed the capabilities of the primary cooling system, a temperature hotspot may occur at the particular portion of the rack computing system 104. In response to the hotspot's creation, mobile soft duct system 120 may be configured supply supplementary air to the particular portion of the rack computing system 104 to meet its cooling needs and mitigate the hotspot. To do so, mobile soft duct system 120 may be configured to deliver air 130 to the rack computing system, such that the soft duct 112 is extended to position vent 118 at a particular location facing rack computing system 104, within a certain minimum distance of the rack computing system 104, or some combination thereof. The vent 118 may be configured to direct air supplied through soft duct 112 from air handling unit 115 to a particular portion of rack computing system 104 based on a particular adjustment of one or more flow control elements associated with the vent 118. Upon mitigation of the hotspot, mobile soft duct system 120 may be re-configured, which may involve retracting the soft duct 112 to a collapsed or stowed configuration, adjusting flow control elements to close the vent 118, controlling some part of air handling unit 115, and the like. In some embodiments, controlling some part of air handling unit 115 includes varying the speed of an internal air moving device (not shown in FIG. 1), such as a blower, in air handling unit 115, using a variable frequency drive.

For illustrative purposes, only two rack computing systems and one mobile soft duct system are shown in FIG. 1. A data center 100 may, however, include any number of racks and any number of mobile soft duct systems. For example, rack computing systems 104 may be arranged in one or more rows in a computing room.

Figure 1A:
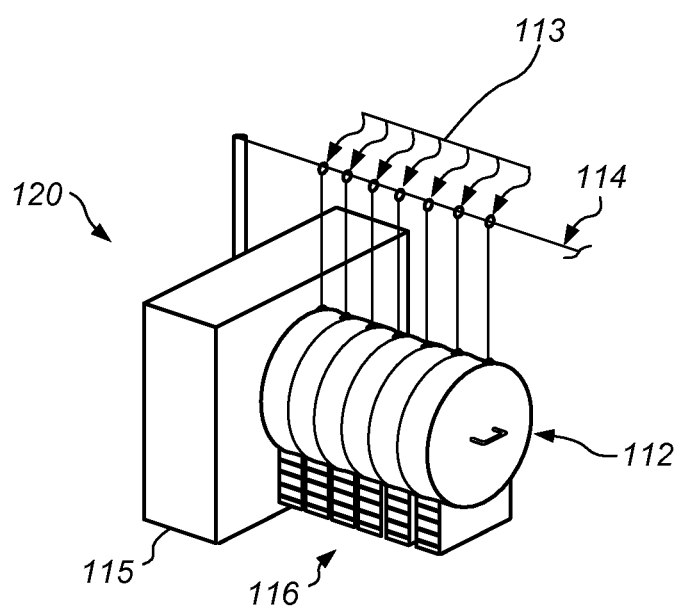
FIG. 1A illustrates a collapsed mobile soft duct system according to one embodiment.

FIG. 1A illustrates a collapsed mobile soft duct system 120 according to one embodiment.

In some embodiments, mobile soft duct system 120 may be configured into a retracted or collapsed configuration. For example, where soft duct 112 is comprised of a flexible material that is collapsible, the soft duct 112 may be collapsed via retraction along the path following the track 114. Such a configuration may enable ease of maintenance access, air flow through an environment, or the like. For example, in the embodiment where mobile soft duct system 120 is a supplementary cooling system in data center 100, the mobile soft duct system 120 may go unused when environmental anomalies are not present in data center 100 and may be configured in a collapsed configuration until needed to supply supplementary air.

In some embodiments, each vent 116 in mobile soft duct system 120 includes an external buffering material to protect against damage from collisions between vents 116, air handling unit 115, or some combination thereof when portions of the soft duct 112 are retracted. Examples of buffering material may include flexible plastic materials, rubber, fabric, mesh, spring devices, and the like.

Figure 2:
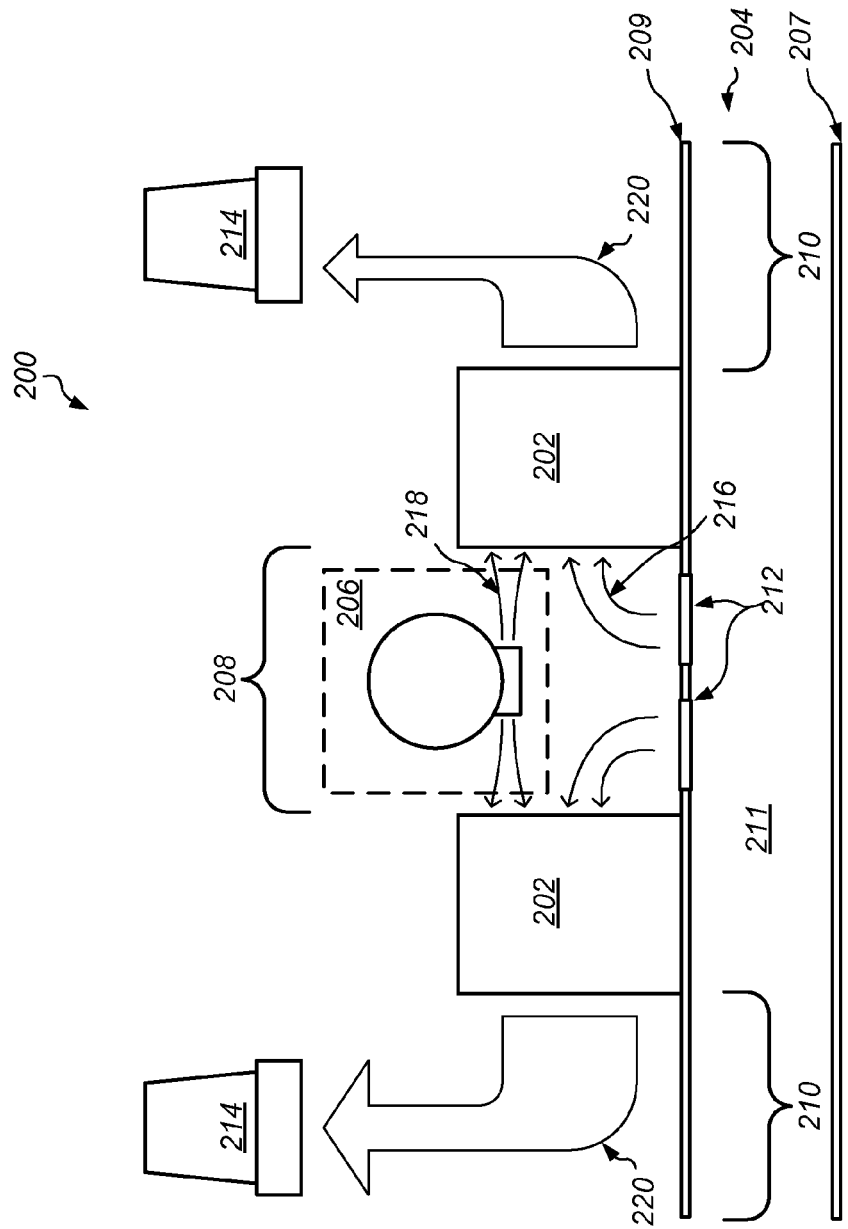
FIG. 2 illustrates a cross-section of a data center with a raised floor plenum primary cooling system and a mobile soft duct supplementary cooling system according to one embodiment.

FIG. 2 illustrates a cross-sectional view of a data center 200 with rack computing systems 202, a raised floor plenum primary cooling system 204, and a mobile soft duct supplementary cooling system 206, according to one embodiment.

The rack computing systems 202 are arranged in rows, such that aisles 208 and 210 extend in parallel on opposite sides of each row of rack computing systems 202. Cold aisle 208 is associated with air supplied to cool each rack computing system 202 facing the cold aisle 208, such that one or more air distributions systems associated with the cold aisle 208 supply air 216 and 218, also referred to herein as "cooling air", to the rack computing systems 202 from the cold aisle 208. Hot aisles 210 are associated with exhaust air, such that one or more exhaust vents 214 associated with hot aisles 210 receive exhaust air 220 exhausted by rack computing systems 202 and remove the exhaust air 220 from the environment proximate to the rack computing systems 202. Air 216 and 218 may pass through one or more rack computing systems 202, absorb and remove waste heat from one or more components, and exit the one or more rack computing systems 202 as exhaust air 220.

In some embodiments, data center 200 includes a primary cooling system 204 that comprises a raised floor plenum 211. The data center 200 may include a raised floor 209, upon which at least some rack computing systems 202 rest, and a lower floor 207, where air may be distributed through the raised floor plenum 211 and supplied to the rack computing systems 202 through particular tiles 212 in the raised floor 209 in the cold aisle 208. For example, in the illustrated embodiment, air may be distributed through the raised floor plenum 211 and supplied as air 216 to one or more rack computing systems 202 through a floor tile 212 in the cold aisle 208. In some embodiments, the floor tile 212 is a perforated floor tile, louver tile, some combination thereof, or some other apparatus that supplies air 216 from plenum 211 to cold aisle 208.

In some embodiments, data center 200 includes a supplementary cooling system 206 that comprises a mobile soft duct system. The mobile soft duct system 206 may supply air 218 to one or more rack computing systems 202 from the cold aisle 208. The air 218 may be supplied in addition or in place of air 216 supplied from the primary cooling system 204. For example, in the illustrated embodiment, mobile soft duct system 206 may supply air 218 to rack computing systems 202 concurrently with the raised floor plenum 211 supplying primary cooling air 216 to the same rack computing systems 202.

In some embodiments, mobile soft duct system 206 supplies air 218 to at least a portion of one or more rack computing systems 202 to supplement or replace the air 216 in response to air 216 being insufficient to the cooling needs of one or more portions of one or more rack computing systems 202. For example, where usage of a particular portion of a rack computing system 202 fluctuates over time, such that the cooling needs of the portion of the rack computing system 202 require more air than air 216 supplied by primary cooling system 204, a temperature hotspot may occur at the particular portion of the rack computing system 202 as waste heat accumulates. In response to the hotspot's creation, mobile soft duct system 206 may be adjusted to a configuration that supplies air 218 to the particular portion of the rack computing system 202 to meet its cooling needs and mitigate the hotspot.

For illustrative purposes, only three rows of rack computing systems, two hot aisles, one cold aisle, one floor tile, and one mobile soft duct system are shown in FIG. 2. A data center may, however, include any number of rack computing systems, hot aisles, cold aisles, floor tiles, and mobile soft duct systems.

Figure 3:
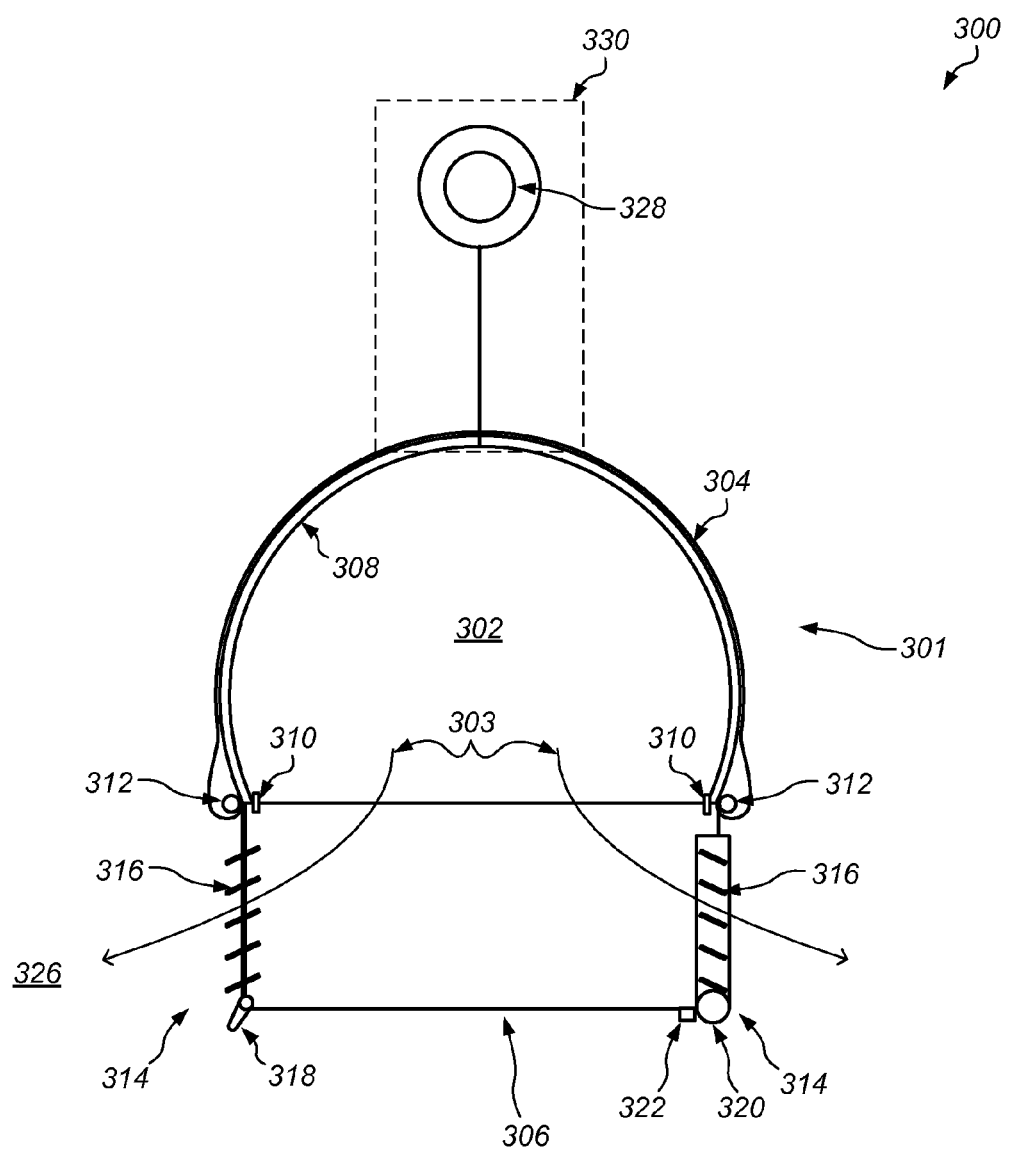
FIG. 3 illustrates a cross-section of a mobile soft duct system according to one embodiment.

FIG. 3 illustrates a cross-section of a mobile soft duct system 300 according to one embodiment. Mobile soft duct system 300 includes a soft duct 301, vent 306, and coupling device 330 (illustrated and discussed in further detail below with reference to FIG. 5).

Soft duct 301 includes one or more passages 302 at least partially bounded by one or more pieces of material 304. In some embodiments, the soft duct 301 includes one or more conduits that further include one or more passages bounded by one or more pieces of material. The conduits and the passages may have any size and shape. The cross section of a duct, conduit, passage, and the like may be square, round, ovate, rectangular, polygonal, or irregular. For example, in the illustrated embodiment, soft duct 301 includes at least one conduit that includes one passage 302 that is bounded on the top and sides by material 304.

In some embodiments, soft duct 301 facilitates distribution of air throughout at least a portion of mobile soft duct system 300 by enabling air to pass through passage 302. For example, in an embodiment where mobile soft duct system 300 supplies air to one or more regions in an environment, air may be passed through at least a portion of soft duct 301 by way of passage 302. The cooling air may be supplied to passage 302 from an air handling unit (not shown in FIG. 3), which may be coupled to one or more ends of soft duct 301.

In some embodiments, soft duct 301 includes one or more hoops 308 that extend circumferentially around at least a portion of a surface of soft duct 301. For example, in the illustrated embodiment, soft duct 301 includes hoop 308 which extends circumferentially around the portion of soft duct that is bounded by material 304. Hoops 308 may be located at various locations along the length of a soft duct 301 and may provide structural support to the soft duct 301. For example, in the illustrated embodiment, hoop 308 may provide structural support to soft duct 301 by coupling with coupling device 330, so that the soft duct 301 is supported from coupling device 330 via hoop 308.

In some embodiments, hoop 308 is coupled to at least a portion of a surface of soft duct 301. The hoop may be coupled to the surface via an adhesive material, coupling device, physical contact, or some combination thereof. For example, where soft duct 301 includes a flexible fabric material 304, hoop 308 may be coupled to material 304 by way of being sewn into the fabric material. In some embodiments, hoop 308 is coupled to an inside surface of material 304. Coupling of the hoop 308 to the inside surface of material 304 may enable hoop 308 to support at least the material 304 bounding the passage 302 of soft duct 301 at least part of the time. For example, where the air pressure in passage 302 is not more than the ambient environment 326, the material 304 may sag and be supported in place by one or more hoops 308 coupled to coupling device 330. Hoop 308 may be coupled to coupling device 330. For example, hoop 308 and coupling device 330 may be welded, coupled by an adhesive or additional coupling device, formed of one or more common pieces of material, or some combination thereof. In some embodiments, where hoop 308 is coupled to an inside surface of material 304, coupling device 330 may extend through a sealed aperture in material 304 to couple with hoop 308, where the aperture may be sealed to prevent leakage from passage 302 to a surrounding environment.

Vent 306 includes one or more outlets 314 that communicate air 303 from passage 302 of soft duct 301 to an ambient environment 326 external to soft duct 301. Vent 306 may include material that bounds at least a portion of passage 302 along at least some portion of the length of soft duct 301. For example, where soft duct 301 is a circular cylindrical conduit bounded by a single piece of material 304, vent 306 may have the approximate shape of a rectangular prism that bounds passage 302 along only a portion of the length of soft duct 301 through an aperture in material 304.

In some embodiments, vent 306 includes one or more coupling points 312 for material 304 to couple with vent 306, such that leakage from passage 302 to the ambient environment 326 from between material 304 and at least a portion of vent 306 is precluded. In some embodiments, material 304 is wrapped around a portion of coupling point 312 to preclude such leakage. For example, in the illustrated embodiment, coupling point 312 is shaped so that material 304 is coupled to vent 306 at least partially by being wrapped around part of coupling point 312. Additional or alternative coupling between vent 306 and material 304 can involve an adhesive, coupling device, welding, some combination thereof, or the like.

In some embodiments, vent 306 is coupled 310 to hoop 308, such that vent 306 is supported at least in part by hoop 308. For example, in the illustrated embodiment, vent 306 is coupled to hoop 308 so that the weight of vent 306 is at least partially transferred to coupling device 330 through hoop 308 and the vent 306 is supported from a track 328 without most of its weight being transferred through material 304. In some embodiments, such as where no hoop 308 is present in at least a portion of soft duct 301, vent 306 is coupled to material 304 such that the weight of vent 306 is at least mostly transferred to a load-bearing structure through material 304. In some embodiments, at least vent 306 and hoop 308 are comprised of at least one common piece of material. For example, at least some of vent 306, hoop 308, and coupling device 330 may be formed out of a single piece of material, including a piece of plastic.

In some embodiments, vent 306 includes one or more outlets 314 that supply air 303 from passage 302 to ambient environment 326. The outlets 314 may be formed so as to direct air in a particular direction. For example, in an embodiment where mobile soft duct system 300 supplies air to particular regions of an environment, one or more outlets 314 may be constructed to direct air 303 from passage 302 to one or more particular regions. In some embodiments, vent 306 includes one or more flow control elements 316 that direct the flow of air 303 from the one or more outlets 314. The flow control elements 316 may be adjustable to direct air flow differently based upon various adjustment configurations of the flow control elements. For example, in the illustrated embodiment, where vent 306 includes two outlets 314, a flow control element 306 is located at each outlet 314 and includes one or more adjustable louvers that can be independently or at least partially collectively adjusted to direct air 303 to various locations in the ambient environment 326. In some embodiments, a flow control element 316 can be adjusted to partially or entirely restrict air from flowing out of one or more outlets 314.

In some embodiments, a flow control element 306 is manually adjusted to direct air to a particular part of ambient environment 326. For example, in the illustrated embodiment, one of the flow control elements 316 includes a louver that is adjustable through a manual lever 318 so that a user can interact with lever 318 to manually adjust the louver 316 to a particular configuration to direct air 303 from passage 302 to a particular location. In some embodiments, a flow control element is motorized to be automatically adjusted to direct air to a particular part of ambient environment 326. For example, in the illustrated embodiment, one of the flow control elements 316 includes a louver that is adjustable by a motor 320 so that the motor can adjust the louver 316 to a particular configuration to direct air 303 from passage 302 to a particular location.

In some embodiments, one or more functions of the motor 320 are implemented based upon signals received from a local source, remote source, or some combination thereof. For example, in some embodiments, motor 320 may be coupled to a remote power source via one or more power transmission lines so that the motor 320 is activated and controlled based upon electrical signals received over the lines. In some embodiments, motor 320 is controlled based upon commands received from a remote source. For example, in the illustrated embodiment, mobile soft duct system 300 includes a transceiver 322 that receives command signals from a remote source, such as a control system 324, via a wireless connection. The command signals may be routed from the transceiver to the motor 320 to move one or more flow control elements 316. In some embodiments, the transceiver 322 includes one or more computer systems that send and receive signals, process and execute received signals, and the like. For example, transceiver 322 may include a computing device that receives and processes command signals and, based on the processing, directs motor 320 to adjust flow control element 316 to a particular configuration.

Figure 4:
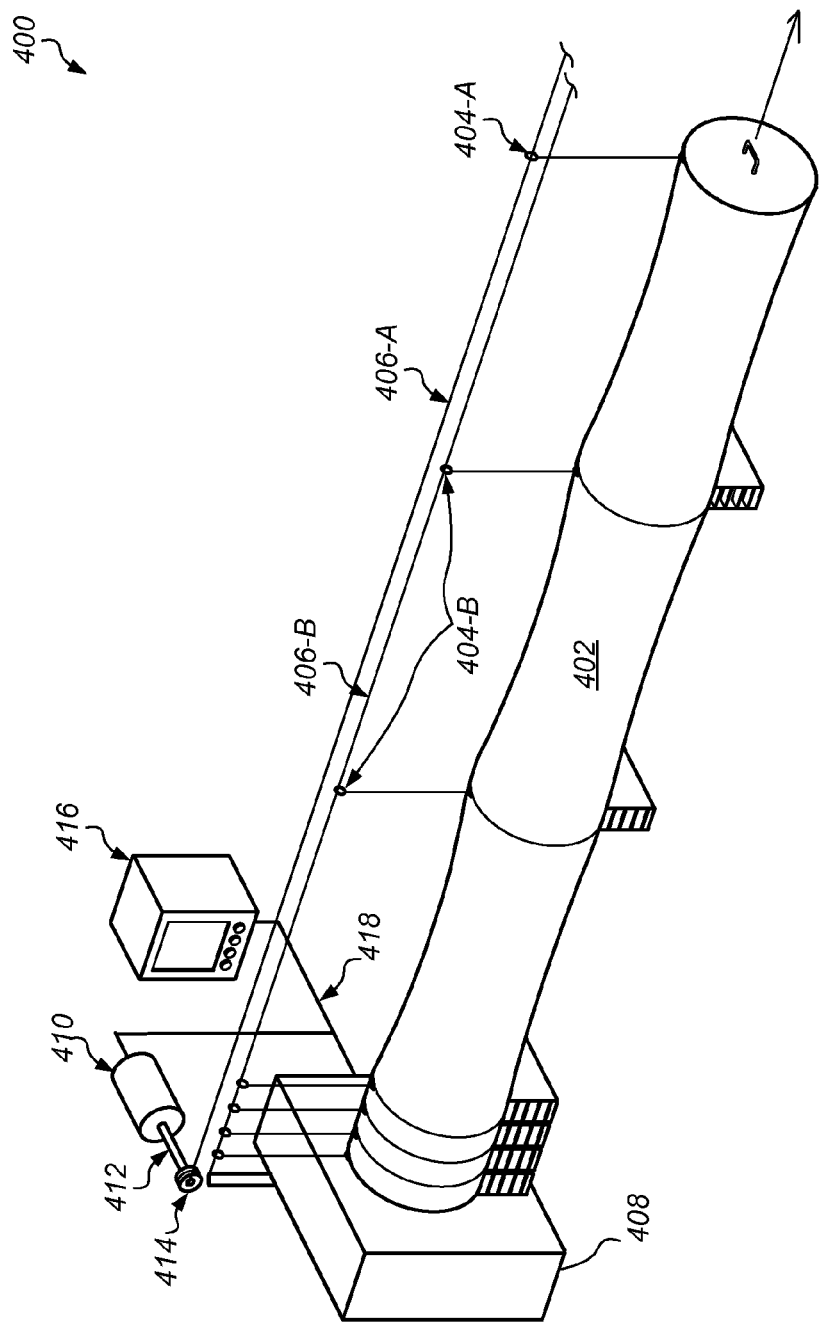
FIG. 4 illustrates a motorized mobile soft duct system according to one embodiment.

FIG. 4 illustrates a motorized mobile soft duct system 400 according to one embodiment.

Mobile soft duct system 400 includes a soft duct 402 that is coupled, via multiple coupling devices 404A-B, to track 406A-B and is coupled at one end to air handling unit 408. In some embodiments, soft duct 402 is at least partially extendable along a path that follows track 406A-B by moving one or more coupling devices 404A-B along the track 406A-B.

In some embodiments, mobile soft duct system 400 is motorized such that one or more components, functions, or some combination thereof associated with mobile soft duct system 402 is implemented through use of one or more motors. For example, in the illustrated embodiment, motor 410 is coupled to track 406-A and implements movement of at least one of the coupling devices 404-A along track 406-A to extend at least a portion of soft duct 402. Motor may be coupled to track 406-A, in some embodiments, by way of a shaft 412 and gear 414 assembly that convert rotating motion by the motor 410 to linear motion by at least a part of track 406-A.

In some embodiments, motor 410 is used to reversibly extend some or all of the soft duct 402 by moving one or more selected coupling devices 404-A of a plurality of coupling devices 404A-B along track 406-A. For example, in the illustrated embodiment, track 406A-B may include two separate tracks, one of which is a motorized track 406-A mechanically coupled to motor 410 via a shaft 412 and gear 414 assembly, and the other of which is a static track 406-B that is not mechanically coupled to motor 410. In such an example, only one or more selected coupling devices 404-A may be coupled to the motorized track 406-A, and the remaining coupling devices 404-B coupled to the static track 406-B, such that operation of the motor 410 to move the motorized track 406-A will move the selected coupling devices 404-A along the motorized track 406-A and the remaining coupling devices 404B may be pulled along the static track 406-B as the soft duct 402 extends due to the motion of the selected coupling devices 404-A.

In some embodiments, motor 410 is controlled so that the soft duct 402 is selectively extended or refracted based upon one or more signals received at the motor 410. Signals can include an electrical current, a data signal directing the motor 410 to perform a certain operation, some combination thereof, or the like. For example, motor 410 may receive a data signal directing the motor 410 to operate in a standard mode for 10 seconds, such that the soft duct 402 is extended via motion of one or more selected coupling devices 404-A along track 406-A due to mechanical coupling with the operating motor 410. In another example, motor 410 may receive a data signal directing the motor 410 to operate in a reverse mode for five seconds, such that the soft duct is refracted via motion of one or more selected coupling devices 404-A along track 406-A due to mechanical coupling with the operating motor 410. In a further example, motor 410 may operate simply based upon receipt of an electrical current powering the motor, where operation of the motor 410 is controlled based upon controlling supply of electrical current to the motor.

In some embodiments, motor 410 is controlled by a control system 416 that controls at least part of the configuration of the mobile soft duct system 402 by controlling operation of motor 410. Control system 416 may be located remotely or locally, or some combination thereof, from mobile soft duct system 402 and may include one or more computer systems and may be coupled to at least motor 410 by way of line 418. In some embodiments, control system 416 communicates with motor 410 via line 418 to control operation of motor 418. In some embodiments, line 418 includes a wireless connection.

In some embodiments, control system 416 directs motor 410 to move at least a portion of track 406, thereby moving at least a portion of soft duct 402 along a path following the track 406, based upon commands in control system 416. The commands may include program instructions stored in a portion of a computer system included in control system 416, program instructions developed dynamically by the computer system, program instructions received from a source external to the computer system, some combination thereof, or the like. For example, in the illustrated embodiment, control system 416 may direct motor 410 based upon program instructions provided to the control system 416 by a user via a user interface included in control system 416. The interface may include a touchscreen display, one or more switches, buttons, a keyboard, a mouse, some combination thereof, or the like. For example, the interface may include a touchscreen display that displays one or more icons associated with various functions associated with mobile soft duct system 400 and one or more fields for the user to enter program instructions. The user may, for example, instruct control system 416 to implement a certain configuration of at least a portion of mobile soft duct system 400 by clicking and holding on a displayed icon associated with extension of the soft duct 402, using a mouse or other device, which control system 416 may respond to by directing motor 410 to move at least a portion of track 406A-B in a certain direction as long as the user continues to hold on the displayed icon.

In some embodiments, the control system 416 stores program instructions associated with predetermined configurations of at least part of the mobile soft duct system 400 which the user selects via interaction with control system 416 via an interface. For example, in a data center environment, distances of extension of soft duct 402 to position certain portions of soft duct 402 at a target location associated with a certain rack computing system (not shown in FIG. 4) may be predetermined and stored in a computing system, so that a user may be presented, via an interface, with various potential configurations of mobile soft duct system 400 that the user may select to position a certain portion of soft duct 402 at a target location associated with a particular rack computing system.

Figure 5:
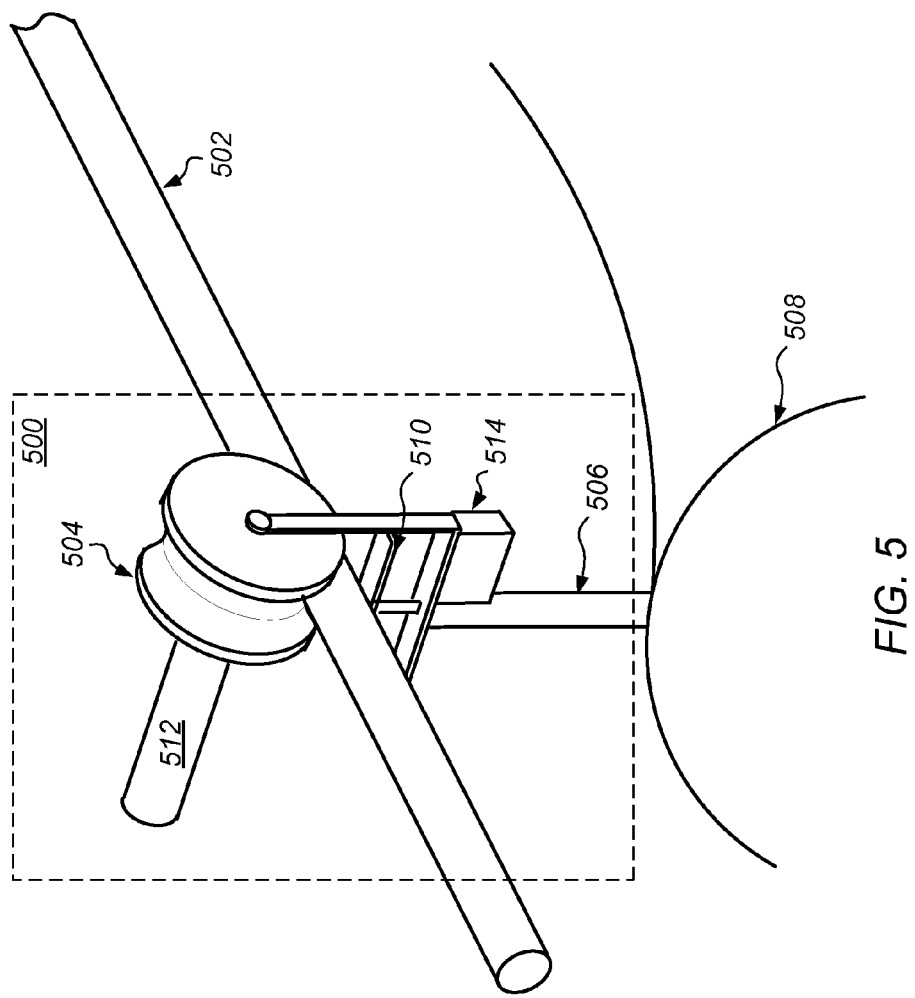
FIG. 5 illustrates a track coupling device according to one embodiment.

FIG. 5 illustrates a coupling device 500 movably coupled to a track 502 according to one embodiment.

Coupling device 500 includes a coupling element 504 that contacts the track 502 and a load-bearing element 506 that connects to hoop 508, thereby enabling the coupling device 500 to transfer the load of various components of a soft duct, including hoops, vents, motors, materials, etc. to the track 502. In some embodiments, the coupling device 500 hangs the hoop 508 and associated soft duct components beneath the track 502. For example, in the illustrated embodiment, the load bearing element 506 includes a hanger element that couples to the track 502 and a hoop 508 so that the soft duct hangs from the track 502 via coupling device 500. In some embodiments, the coupling device 500 rests the hoop 508 and associated soft duct on the track 502, such that the associated soft duct is located at least partially above the track 502.

In some embodiments, a coupling element 504 movably couples the coupling device 500 with track 502 so that the coupling device 500 can be moved along the track 502. Moving a coupling device 500 along a track 502 may move at least a portion of a soft duct along a path that generally follows the track 502. For example, in the illustrated embodiment, coupling element 504 includes a track wheel that rolls along a portion of track 502, such that coupling device 500 moves along track 502 due to the rolling contact between track wheel 504 and the track 502, where movement of the coupling device 500 also moves at least a portion of a soft duct by moving a hoop 508 coupled to the coupling device. Continuing the example, where the hoop 508 is attached to a surface of the soft duct, moving the coupling device 500 along the track 502 may extend the soft duct along a path that generally follows the track 502 by moving the hoop 508 which moves at least some material comprising the surface of the soft duct.

In some embodiments, the coupling element 504 is a simple coupling element that slidingly contacts the track 502. For example, coupling element 504 may include a hook element that rests on the track 502, such that the load of the hoop 508 and associated soft duct, transferred via load bearing element 506, provides sufficient force to hold the hook in place on the track 502 until sufficient force is applied to the hook to slide it along the track 502.

In some embodiments, coupling device 500 includes a brake component 510 that engages to hold the coupling device 500 at a particular location on the track 502 by locking the coupling element 504 into place. The coupling device 500 may be held in place to hold at least a portion of a soft duct coupled to the coupling device 500 at a particular location. For example, where a particular vent coupled to a soft duct is to be positioned at a particular location to deliver air to a particular target, the soft duct may be held in place at a certain amount of extension from an air handling unit by engaging one or more braking components 510 on one or more coupling devices 500 of the mobile soft duct system. In some embodiments, only some of the coupling devices 500 in a mobile soft duct system include one or more braking components.

In some embodiments, braking component 510 engages with a portion of track 502 opposite the portion contacted by coupling element 504. In some embodiments, braking component 510 is manually engaged. For example, a lever or other device may be coupled to braking component 510 that enables a user to manually engage the braking component 510, thereby holding the coupling device 500 at a particular location on the track 502.

In some embodiments, coupling device 500 includes a motor 512 that can manipulate one or more components of coupling device 500. For example, where coupling element is a wheel element that can rollingly contact track 502, the motor 512 may be coupled to coupling element 504 so that the motor 512 can rotate the coupling element 504 along the track 502, thereby moving the coupling device 500 along the track. In some embodiments, motor 510 may be coupled to one or more braking components 510 so that the motor 512 can engage the brake 510 to hold the coupling device 500 in place on the track 502.

In some embodiments, motor 512 is manually controlled via a switch or some other interface proximate to coupling device 500. For example, a control switch may be located on coupling device 500 with which a user can interact to activate the motor to move the coupling device 500 forwards or backwards along track 502, thereby extending or retracting at least a portion of the soft duct.

In some embodiments, one or more functions of the coupling device 500 are implemented based upon signals received from a remote source. For example, in some embodiments, one or more components in coupling device 500, including motor 512 and braking component 510, may be coupled to a remote power source via one or more power transmission lines so that the components are activated and controlled based upon electrical signals received over the lines. In some embodiments, one or more components are controlled based upon commands received from a remote source. For example, in the illustrated embodiment, coupling device 500 includes a transceiver 514 that receives command signals from a remote source via a wireless connection. The command signals may be routed from the transceiver 514 to one or more components to execute the commands, such as a movement command routed to the motor 512 to move the coupling device 500, a braking command routed to the braking component 510 to hold the coupling device 500 in place on track 502, or the like. In some embodiments, the transceiver 514 includes one or more computer systems that send and receive signals, process and execute received signals, and the like. For example, transceiver 514 may include a computing device that receives and processes command signals and, based on the processing, directs one or more components, including motor 512 and braking component 510, to perform certain functions.

Figure 6:
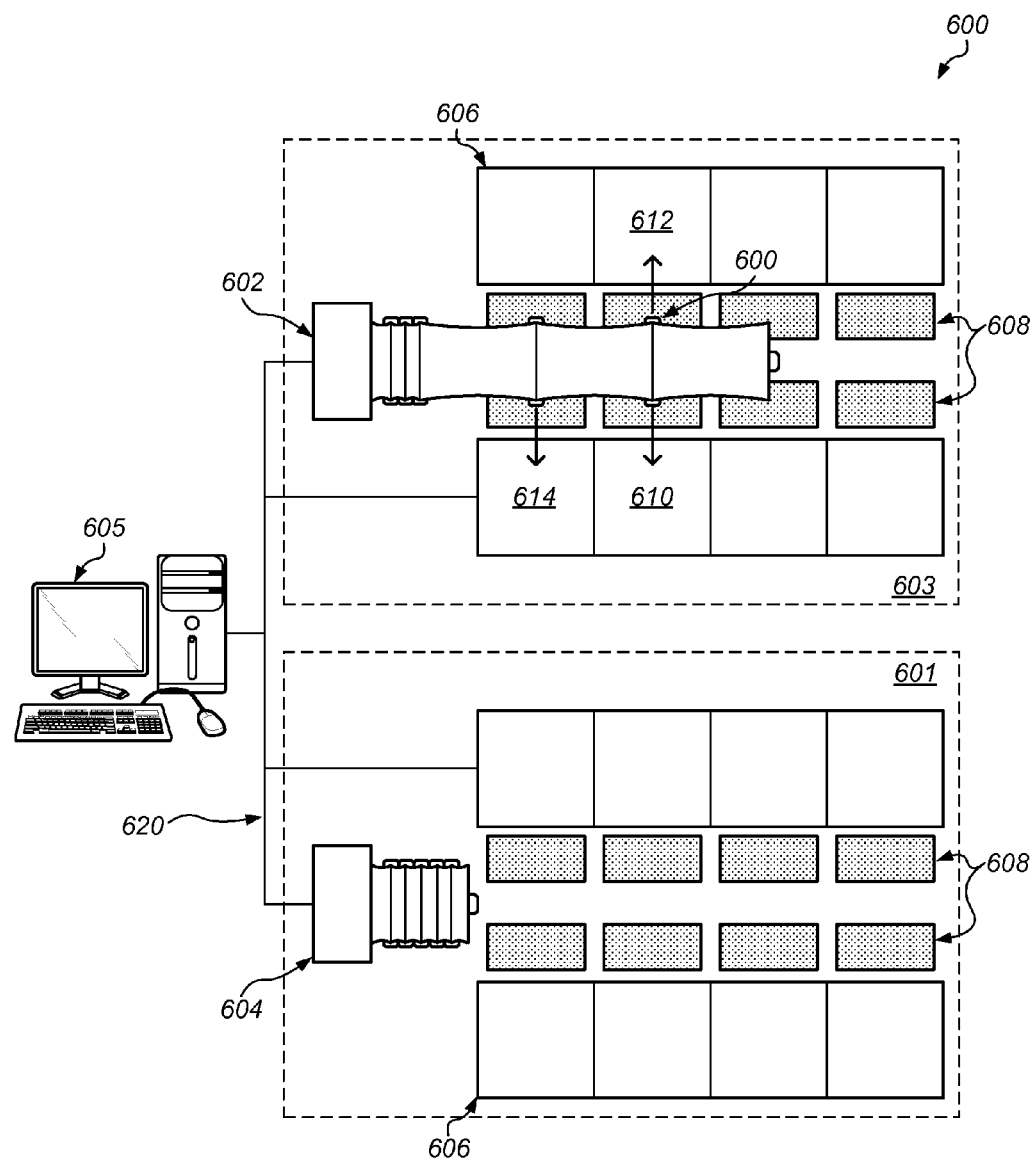
FIG. 6 illustrates a data center with a plurality of mobile soft duct systems managed by a control system to direct cooling air to various rack computing systems according to one embodiment.

FIG. 6 illustrates a data center 600 with a plurality of mobile soft duct systems 602 and 604 managed by a control system 605 to direct cooling air to various rack computing systems 606 according to one embodiment.

Data center 600 includes mobile soft duct systems 602 and 604, multiple rack computing systems 606 arranged in multiple rows facing one of cold aisles 601 and 603, a primary cooling system including perforated floor tiles 608, control system 605 coupled to at least some of the mobile soft duct systems and primary cooling systems by way of lines 620. In some embodiments, one or more of lines 620 include a wireless connection between control system 605 and one or more components in data center 600. For example, power monitoring system may be remotely located from both cold aisles 601 and 603 and coupled to some of a primary cooling system and mobile soft duct systems 602 and 604 in each by way of one or more wireless connections. In some embodiments, control system 605 may be coupled to various components associated with a primary cooling system. For example, control system 605 may be communicatively coupled to one or more air handling units, sensors, and the like.

In some embodiments, primary cooling systems can include one or more of various cooling systems, including raised floor plenums, fixed ductwork, etc. For example, in the illustrated embodiment, the primary cooling system 608 includes perforated floor tiles of a raised floor plenum that supply cooling air from the raised floor plenum to the rack computing systems 606 from one of cold aisles 601 and 603. The primary cooling system may include one or more air handling units that supply air to some part of the data center 600, including one or more air handling units that supply air to a raised floor plenum.

In some embodiments, the control system 605 manages an air distribution system in data center 600, including some or all of a primary cooling system and mobile soft duct systems 602 and 604, to manage air distribution and mitigate environmental anomalies in data center 600. Such management may involve selectively using one or more of the primary cooling system and mobile soft duct systems 602 and 604 to deliver air to rack computing systems 606.

For example, as shown in the illustrated embodiment, where perforated tiles 608 at cold aisle 601 supply sufficient cooling air to meet the cooling air needs of rack computing systems in cold aisle 601, the control system maintains the mobile soft duct system 604 stowed in a retracted state. But, in the illustrated embodiment, where the perforated floor tiles 608 in cold aisle 603 are determined to be insufficient to meet the cooling air needs of rack computing systems 610, 612, and 614, control system 605 may direct at least a portion of mobile soft duct system 602 to supply supplementary cooling air to rack computing systems 610, 612, and 614 to meet such needs. Such directing by control system 605 may involve directing one or more components to extend mobile soft duct system to a requisite length such that one or more particular vents 614 are positioned to individually or collectively deliver cooling air to racks 610, 612, and 614 and directing one or more components to adjust one or more flow control elements to such that air is directed from selected vents 614 to the rack computing systems 610, 612, and 614.

In some embodiments, control system 605 selectively manages one or more of the primary cooling system and mobile soft duct systems 602 and 604 to respond to and mitigate various environmental anomalies in data center 600. Such anomalies may include temperature hotspots and coldspots, airflow stagnation, backpressure in an air distribution system, and the like. For example, in the illustrated embodiment, control system 605 may respond to detecting temperature hotspots in rack computing systems 610, 612, and 614 by directing mobile soft duct system 602 to delivery supplementary cooling air to those rack computing systems to supplement the primary cooling system 608.

Figure 7:
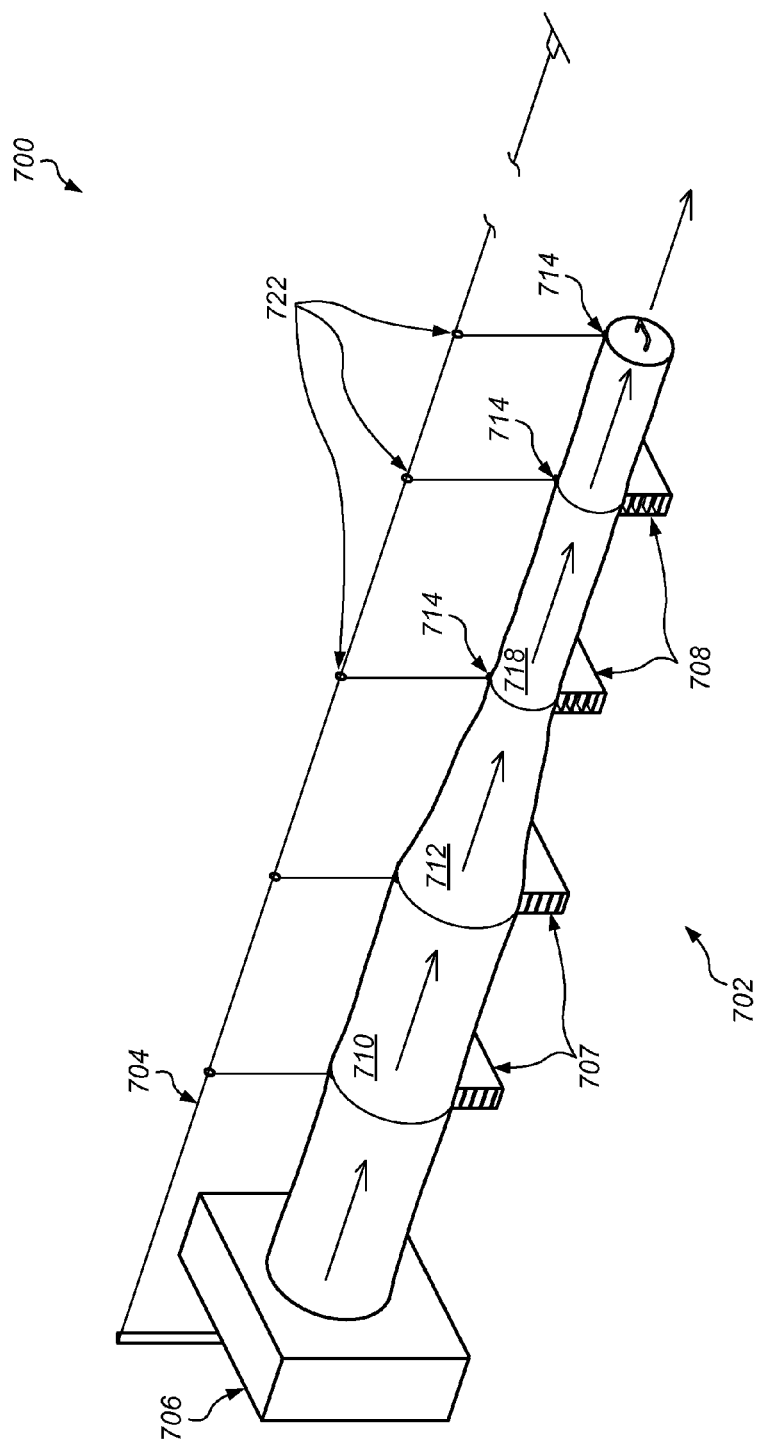
FIG. 7 illustrates an extended mobile soft duct system with contracted passages according to one embodiment.

FIG. 7 illustrates an extended mobile soft duct system 700 with contracted passages according to one embodiment.

Mobile soft duct system 700 includes a soft duct 702 that may be extended from air handling unit 706 along track 704. In the illustrated embodiment, for example, the soft duct 702 is extended a certain distance.

In some embodiments, various portions of a soft duct 702 may be contracted to reduce their cross sectional area. Such contraction may improve airflow through the soft duct to one or more vents by maintaining air flow velocity above a certain minimum level. For example, in the illustrated embodiment, where soft duct 702 is extended and vent 708 is adjusted to direct air to a target location, while vents 707 are closed, the soft duct 702 includes various passages 710, 712, 718 that can be selectively and differently contracted or dilated to manage airflow through the various passages and vents in the soft duct 702. As further shown in the illustrated embodiment, passage 710 remains uncontracted, but passage 712 is contracted to a first reduced cross sectional area at one end and passage 718 is contracted to the first reduced cross sectional area at both ends.

In some embodiments, cross sectional area contraction is implemented by one or more contraction elements coupled to hoop elements in the mobile soft duct system. Such contraction elements may contract the cross sectional area by cinching one or more hoops at particular locations along the soft duct 702. Contracting elements may include one or more motors 714. For example, in the illustrated embodiment, motors 714 are coupled to hoops in the soft duct 702. The motors 714 may contract cross sectional areas of portions of the soft duct 702 by contracting one or more hoops coupled to the soft duct surface, contracting one or more other elements, such as a cable extending around one or more passages of the soft duct 702, or the like. The motors 714 may be coupled to one or more various components in the mobile soft duct system. For example, in the illustrated embodiment, motors 714 are coupled to separate coupling devices 722, such that the coupling devices 722 transfer the load of the motors 714 to the track 704.

In some embodiments, the contracting elements are controlled separately and individually to separately contract different portions of a soft duct to different cross sectional areas. Such individual contraction can enable gradual contraction of a soft duct along its extended length to ensure uniform flow characteristics through one or more passages along some or all of the soft duct length. For example, in the illustrated embodiment, passage 718 is contracted to a first cross sectional area and passage 712 is partially contracted to the first cross sectional area. Such gradual contraction may be implemented where, for example, multiple vents 708 along the length of soft duct 702 are directing air from one or more passages in soft duct 702, and a uniform flow of air through each vent is desired.

Figure 8:
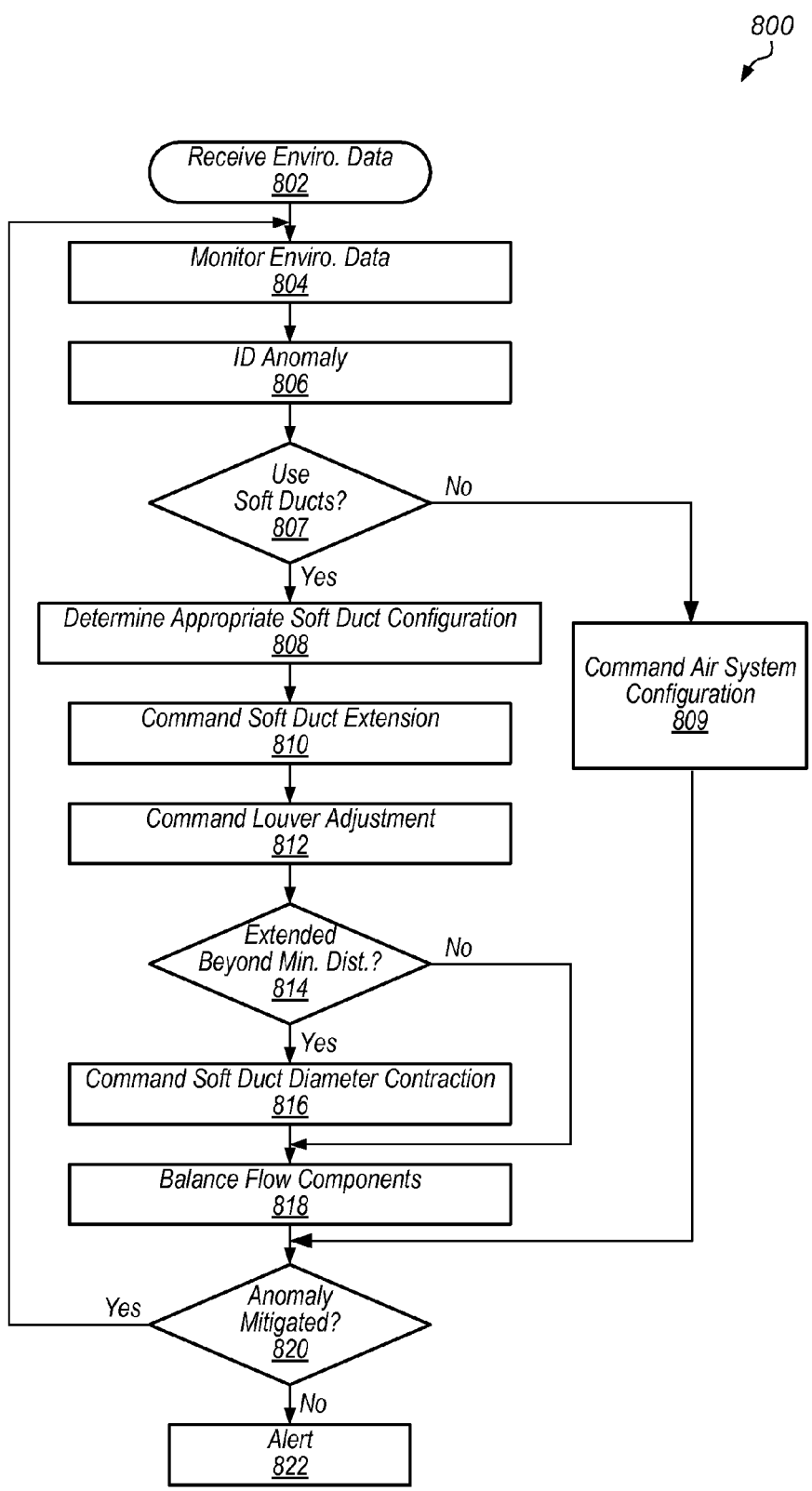
FIG. 8 illustrates managing a supply of cooling air to a target location using a mobile soft duct system according to one embodiment.

FIG. 8 illustrates managing a supply of cooling air to a target location 800 using a mobile soft duct system according to one embodiment. In some embodiments, such management is implemented by part or all of a control system. In some embodiments, the control system implementing such management is associated with a computing room in a data center.

At 802, environmental data associated an environment is received. In some embodiments, the environment is a room where a mobile soft duct system is configured to deliver air. For example, in a data center where a mobile soft duct system is configured to supply supplementary air, the environment may include a computing room including one or more rows of rack computing systems supplied with air from a primary cooling system, including a fixed ductwork, raised floor plenum, etc. In such an environment, one or more mobile soft duct computing systems may be configured to be extended along one or more cold aisles to supplement the air supplied by the primary cooling system to meet fluctuating cooling needs of various rack computing systems.

In some embodiments, the environmental data includes temperature data associated with various locations in the environment. In a data center, the temperature data may include temperatures at various intake, exhaust, and internal points in one or more rack computing systems. In some embodiments, the environmental data includes airflow data associated with various locations in the environment. In some embodiments, environmental data is received from one or more sensor devices, an environmental monitoring system, etc. For example, an environmental monitoring system may include a Building Management System (BMS), an industrial control system including a Supervisory Control and Data Acquisition (SCADA) system, and the like. Various other methods and systems for receiving environmental data may be known to persons having ordinary skill in the art and are encompassed by the disclosure.

At 804, the environmental data is monitored for anomalies. In some embodiments, such monitoring is continuous, periodic, intermittent, based upon one or more trigger events, etc. Various different types of anomalies can be monitored for concurrently. For example, in a data center environment, monitoring may include monitoring temperature data to determine whether a hotspot or coldspot is occurring or about to occur at or near one or more rack computing systems by monitoring temperature data. Monitoring may also involve monitoring for anomalies in airflow data, including monitoring for stagnation, back pressure in some or all selected portions of the air distribution system, etc. Various methods and systems for monitoring environmental data for anomalies may be known to persons having ordinary skill in the art and are encompassed by the disclosure.

At 806, an environmental anomaly is identified. In some embodiments, the anomaly is a temperature anomaly. For example, in a data center environment, an environmental anomaly may be a temperature value associated with a particular rack computing system that is determined to have exceeded a high-temperature threshold such that a hotspot is identified at the particular rack computing system.

In some embodiments, the identified anomaly can be associated with a particular location or region in the environment. For example, in a data center environment, where an identified anomaly is a temperature hotspot, the hotspot may be associated with a particular computing system in a rack computing system, a particular part of a particular rack computing system, etc. Various methods and systems of identifying one or more environmental anomalies based at least in part on environmental data may be known to persons having ordinary skill in the art and are encompassed by the disclosure.

At 807, upon detection of an anomaly, a determination is made whether to utilize some or all of a mobile soft duct system to mitigate the anomaly. For example, in a data center environment where a primary cooling system includes a raised floor plenum and a supplementary cooling system includes a mobile soft duct system, the determination may involve determining whether the anomaly can be mitigated within certain constraints through management of the primary cooling system without the mobile soft duct system. Constraints may include estimated mitigation time with using various cooling systems, additional resource costs associated with various options, etc. Such management of the primary cooling system, as shown at 809, may include directing one or more air moving devices, such as fans or blowers, in a raised floor plenum to increase or decrease the air flow rate through one or more floor tiles.

At 808, if some or all of the mobile soft duct system is to be used to mitigate the anomaly, an appropriate configuration of the mobile soft duct system is determined. In some embodiments, an appropriate configuration is a configuration of various components in the mobile soft duct system that will direct air to a target location to mitigate the environmental anomaly. For example, in a data center environment, an appropriate configuration may involve extending some or all of a mobile soft duct system to a particular location so that one or more vents included in the mobile soft duct system can direct air to a particular rack computing system experiencing an identified temperature hotspot.

In some embodiments, the configuration may include a particular adjustment of one or more flow control elements to direct air to a specific target. For example, where a hotspot is associated with a particular portion of a particular rack computing system, including a particular air intake, the appropriate configuration may include a particular adjustment of one or more vents to direct air from one or more passages of a soft duct to the particular portion. In some embodiments, the configuration may include adjusting the distance of the soft duct from the track. For example, where the particular portion of the particular rack computing system is close to the floor, the appropriate configuration may include lowering at least a portion of a soft duct closer to the floor, so that air can be directed from one or more vents at the particular portion of the particular rack computing system.

At 810, extension of at least a portion of a mobile soft duct system is commanded. For example, where the mobile soft duct system is in a collapsed state such that the soft duct is collapsed at or near the air handling unit, extension may include commanding one or more motors to extend at least a part of the soft duct to position one or more vents to direct air to a target location to mitigate the identified hotspot. Such a commanding may involve sending command signals to one or more motors, providing electrical power to power one or more motors, or some combination thereof.

In some embodiments, one or more motors may be directed to extend the soft duct to a particular extension configuration, such that one or more particular vents are located in a particular location. The particular location may be determined in the appropriate configuration as an optimal location from which to direct air to mitigate the environmental anomaly. In some embodiments, one or more motors may be directed to extend the soft duct until one or more particular vents are within a certain predetermined distance of a target location so that the vents can be adjusted to direct air to the target location to mitigate the environmental anomaly.

At 812, adjustment of one or more flow control elements in a mobile soft duct system is commanded. In some embodiments, where the appropriate configuration includes using a particular vent to direct air to a target location to mitigate the identified environmental anomaly, the appropriate configuration may include a particular adjustment of a flow control element in the vent to direct air to the target location. For example, in a data center environment, a louver in a vent may be commanded to adjust to a certain position to supply an optimal directing of air to a particular portion of a rack computing system to mitigate a temperature hotspot associated with that portion of the rack computing system. Such a commanding may involve sending command signals to one or more motors, providing electrical power to power one or more motors, or some combination thereof. For example, where adjustment of a flow control element is controlled by a motor, the commanding may involve sending a command signal to the motor to adjust the flow control element to a particular setting.

At 814 and 816, contraction of at least a portion of the soft duct is commanded if a determination is made that the portion of the extended soft duct should be contracted. In some embodiments, such a determination is made as part of determining an appropriate configuration of the mobile soft duct system. In some embodiments, the determination is made in response to determining that a portion of the soft duct is extended beyond a certain distance from the air handling unit.

In some embodiments, a determination to contract various portions of the soft duct may include determining the amount of contraction based upon the distance of extension of the soft duct. For example, if the soft duct is extended beyond a first distance from the air handling unit, a determination may involve determining to contract a portion of the extended soft duct to a first setting. In another example, if the soft duct is extended beyond a longer second distance from the air handling unit, a determination may involve determining to contract a various portions of the extended soft duct to various settings, such as contracting a first portion to a first setting and contracting a second portion following the first portion in series along the soft duct to a second setting.

In some embodiments, contraction is determined upon length of extension of the soft duct, which vents in the soft duct are directing air, or some combination thereof. For example, if the soft duct is to be extended a certain distance such that some amount of contraction is determined necessary, and two vents at different locations along the soft duct are directing air to two separate targets, the soft duct may be variously contracted along its length to maintain a uniform airflow through both vents.

At 818, various components in the air distribution system are adjusted to balance supply of air. In some embodiments, one or more air handling units may be commanded to increase or decrease airflow through one or more mobile soft duct systems, raised floor plenums, fixed ducts, etc. to maintain environmental parameters within a certain range. For example, in a data center environment, configuring a mobile soft duct system to deliver supplementary air to a rack computing system may affect airflow through a raised floor plenum, or vice versa, such that an air handling unit for the raised floor plenum is directed to increase or reduce airflow through the raised floor plenum. Air handling units may be commanded to change airflow by commanding one or more control units to vary the speed of air moving device, such as a blower, in an air handling unit using a variable frequency drive.

At 820, the environmental data is monitored to determine if the environmental anomaly is mitigated. In some embodiments, mitigation is determined based upon one or more environmental parameters associated with a region crossing a certain threshold. For example, in a data center environment, a hotspot may be determined to be mitigated at a rack computing system if temperature values association with at least a portion of the rack computing system fall below a certain threshold, which may be the same or different from a high-temperature threshold that triggers hotspot identification.

If the hotspot is mitigated, monitoring continues. In some embodiments, the mobile soft duct system is re-configured upon hotspot mitigation, including retracting a soft duct and discontinuing supply of air from the mobile soft duct system. In some embodiments, the mobile soft duct system is left in its present configuration until another anomaly is detected. For example, where a mobile soft duct system is configured to mitigate a hotspot, the configuration may be left in place until another anomaly, such as a coldspot, is detected at one or more locations in the environment.

If, as shown at 822, the anomaly is not mitigated, an alert indication is provided. In some embodiments, an alert comprises sending an indication to an operator of the existence of an anomaly that was not mitigated. The alert indication may indicate the specific region, associated elements, and environmental parameters associated with the anomaly. For example, in a data center environment, the alert indication may identify a specific rack computing system experiencing a hotspot, as well as an indication of the current temperature, estimated time until the rack computing system must shut down due to the hotspot, etc. The operator may implement additional mitigation functions to mitigate the anomaly. For example, in a data center environment, where configuration of a mobile soft duct system fails to mitigate a hotspot, an operator may be informed of the hotspot so that additional mitigation steps can be taken, such as introducing a fan apparatus near the rack computing system experiencing the hotspot to deliver additional air, removing a raised floor plenum tile to deliver additional air, and the like.

In some embodiments, a subsequent configuration of the mobile soft duct system may be implemented following or concurrently with sending the alert indication. For example, in anticipation of operator-implemented functions, and where the configuration of the mobile soft duct system has lowered at least a portion of the soft duct closer to the floor, a subsequent configuration may involve raising the portion of the soft duct to better facilitate the operator-implemented functions.

Figure 9:
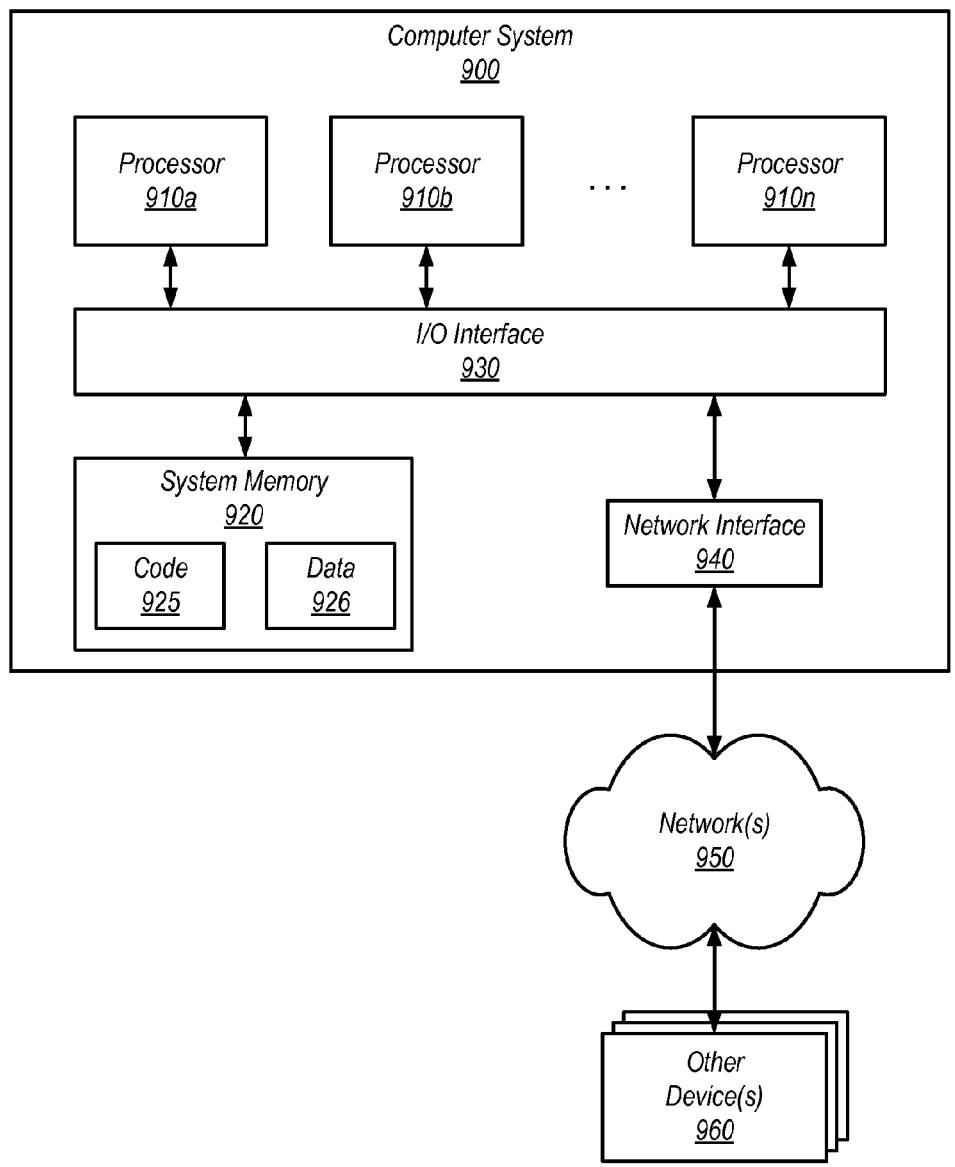
FIG. 9 is a block diagram illustrating an example computer system that may be used in some embodiments.

FIG. 9 is a block diagram illustrating an example computer system that may be used in some embodiments.

In some embodiments, a system that implements a portion or all of one or more of the technologies, including but not limited to a portion or all of the mobile soft duct system, the control system, one or more modules included in the control system, and air distribution management methods, systems, devices, and apparatuses as described herein, may include a general-purpose computer system that includes or is configured to access one or more computer-accessible media, such as computer system 900 illustrated in FIG. 9. In the illustrated embodiment, computer system 900 includes one or more processors 910 coupled to a system memory 920 via an input/output (I/O) interface 930. Computer system 900 further includes a network interface 940 coupled to I/O interface 930.

In various embodiments, computer system 900 may be a uniprocessor system including one processor 910, or a multiprocessor system including several processors 910 (e.g., two, four, eight, or another suitable number). Processors 910 may be any suitable processors capable of executing instructions. For example, in various embodiments, processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store instructions and data accessible by processor(s) 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the mobile soft duct system, the control system, one or more modules included in the control system, and air distribution management methods, systems, devices, and apparatuses as described herein, are shown stored within system memory 920 as code 925 and data 926.

In one embodiment, I/O interface 930 may be configured to coordinate I/O traffic between processor 910, system memory 920, and any peripheral devices in the device, including network interface 940 or other peripheral interfaces. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices 960 attached to a network or networks 950, such as other computer systems or devices as illustrated in FIGS. 1 through 8, for example. For example, network interface 940 may be configured to allow data to be exchanged between computer system and one or more sensor devices, a sensor management system, some or all of the mobile soft duct system, or the like. In various embodiments, network interface 940 may support communication via any suitable wired or wireless general data networks, such as types of Ethernet network, for example. Additionally, network interface 940 may support communication via telecommunications/telephony networks such as analog voice networks or digital fiber communications networks, via storage area networks such as Fibre Channel SANs, or via any other suitable type of network and/or protocol.

In some embodiments, system memory 920 may be one embodiment of a computer-accessible medium configured to store program instructions and data for implementing embodiments of air distribution management methods as described above relative to at least FIG. 8. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 900 via I/O interface 930. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 900 as system memory 920 or another type of memory. Further, a computer-accessible medium may include transmission media or signals such as electrical, electromagnetic, or digital signals, conveyed via a communication medium such as a network and/or a wireless link, such as may be implemented via network interface 940.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
    a plurality of rack computing systems arranged in a row and a cold aisle extending along a side of the row, the rack computing systems configured to receive air from the cold aisle;
    a mobile soft duct cooling system configured to supply air to at least one of the rack computing systems from the cold aisle, the mobile soft duct cooling system comprising:
        a track extending configured to span a first length of space along the cold aisle; and
        at least one soft duct comprising at least one collapsible conduit having at least one interior passage that is at least partially bounded by a flexible material; and
        at least one vent, coupled to the soft duct, comprising at least one outlet including adjustable louvers, the vent configured to provide an adjustable flow of air supplied from the interior passage of the collapsible conduit through the outlet based on an adjustment setting of the louvers; and
    a control system configured to control, based at least in part on monitored environmental data, extension of the soft duct along the track to a targeted position such that the vent directs the air to the at least one of the plurality of rack computing systems, wherein the soft duct is configured to be reversibly extended along at least a portion of the first length of space to position the vent at a target location to direct air supplied through the first passage to a cooling target.

2. The system of claim 1, further comprising:
    a first motor configured to extend, in response to a command from the control system, the soft duct along the track to the targeted position; and
    a second motor configured to adjust, in response to another command from the control system, the louvers to the adjustment setting.

3. The system of claim 2, further comprising:
    a primary cooling system configured to supply primary air to the rack computing systems from the cold aisle to meet cooling requirements of the rack computing systems;
    wherein the control system is configured to:
        manage air supplied to the rack computing systems, wherein to manage air supplied to the rack computing systems, the control system is configured to manage the primary cooling system and the mobile soft duct cooling system; and
        in response to determining that the primary air is failing to meet cooling requirements of at least one of the rack computing systems, direct the first motor to extend the soft duct along the track to the targeted position, and direct the second motor to adjust the louvers to the adjustment setting.

4. The system of claim 1, wherein the at least one interior passage is configured to be reversibly contracted such that a cross-sectional area of the at least one interior passage is changed.

5. A system, comprising:
    a track configured to span a first length of space;
    a soft duct comprising at least one first passage at least partially bounded by a flexible material;
    a vent, coupled to the soft duct, comprising an outlet and configured to direct air supplied through the first passage via the outlet; and
    a control system configured to control, based at least in part on monitored environmental data, movement of at least a portion of the soft duct along at least a portion of the track, wherein the soft duct is configured to be reversibly extended along at least a portion of the first length of space to position the vent at a target location to direct air supplied through the first passage to a cooling target.

6. The system of claim 5, comprising:
    a hoop coupled to a surface of the first passage and extending circumferentially along at least a portion of a cross-sectional circumference of the first passage; and
    the hoop is further coupled to the vent and a coupling device configured to move the hoop along the first length of space to reversibly extend the soft duct.

7. The system of claim 5, further comprising a brake configured to lock at least a portion of the soft duct at a position on the track, such that the at least a portion of the soft duct is immobilized with regard to the target location.

8. The system of claim 5, wherein the track comprises a first motor configured to extend at least a portion of the soft duct along the first length of space to position the vent at the target location.

9. The system of claim 8, wherein the vent comprises:
    at least one adjustable flow control element configured to direct air supplied through the first passage to the cooling target via the outlet based upon a selected position of the flow control element; and
    a second motor configured to adjust the flow control element to the selected position to direct air to the cooling target from the first passage through the vent.

10. The system of claim 9, wherein the control system is configured to:
    direct the first motor to reversibly extend the at least a portion of the soft duct along the first length of space; and
    direct the second motor to adjust the flow control element to the selected position to direct air supplied through the first passage to the cooling target.

11. The system of claim 10, wherein the control system is configured to:
  direct the first motor to extend the at least a portion of the soft duct in response to determining, based on temperature data received from at least one sensor device, that a first temperature measurement associated with the target exceeds a temperature threshold; and
  direct at least the first motor to retract the soft duct in response to determining, based upon subsequent temperature data received from the at least one sensor device, that a second temperature measurement is less than the temperature threshold.

12. The system of claim 5, wherein the soft duct includes at least one second passage coupled in series to the first passage, wherein the second passage is a truncated conical passage configured to provide an increased flow velocity of air supplied from the first passage through an outlet of the second passage.

13. The system of claim 5, wherein the soft duct comprises an attachment device at one end of the first passage, the attachment device configured to couple the first passage of the soft duct to a separate passage of a separate soft duct.

14. The system of claim 5, wherein the soft duct comprises an end plate capping the first passage, such that a flow of air is restricted at the end plate, wherein the end plate comprises at least one handle configured to enable the soft duct to be manually extended.

15. A method, comprising:
  performing, by at least one computer device:
    monitoring environmental data for a space; and
    controlling, based at least in part on the monitored environmental data, movement of a portion of a soft duct along a predetermined track, that is configured to span a first length of the space, such that a vent coupled to the portion of the soft duct is positioned at a particular location for distribution of air through at least one first passage of the soft duct and out a first outlet of the vent, wherein the at least one first passage is at least partially bounded by a flexible material, and wherein the soft duct is configured to be reversibly extended along at least the portion of the first length of space to position the vent at a target location to direct air supplied through the first passage to a cooling target.

16. The method of claim 15, further comprising:
  based at least in part on the monitored environmental data, determining a soft duct configuration for the space; and
  directing a second motor to adjust a flow control element associated with the first outlet to a specified position, according to the determined soft duct configuration, to direct the air to a target location within the space.

17. The method of claim 16, further comprising:
  determining, from the monitored environmental data, first temperature data associated with the target location;
  identifying an anomaly within at the target location based at least in part on the first temperature data; and
  wherein said determining the soft duct configuration for the space is performed, at least in part, in response to identifying the anomaly.

18. The method of claim 17, further comprising directing at least a third motor to adjust at least a second flow control element in at least a second outlet to adjust a flowrate of the air directed to the target location through the first outlet, according to the determined soft duct configuration.

19. The method of claim 16, further comprising directing another motor to contract a cross-sectional area of a first portion of the soft duct, according to the determined soft duct configuration, to increase a flow velocity of the air supplied through at least the first portion of the soft duct.

20. The method of claim 19, wherein an amount of contraction for the cross-sectional area of the first portion of the soft duct is determined based at least in part on a distance the soft duct is extended from an origin point along the predetermined track.

* * * * *